United States Patent [19]

Nishiuchi

[11] Patent Number: 4,489,246
[45] Date of Patent: Dec. 18, 1984

[54] FIELD EFFECT TRANSISTOR LOGIC CIRCUIT HAVING HIGH OPERATING SPEED AND LOW POWER CONSUMPTION

[75] Inventor: Koichi Nishiuchi, Sagamihara, Japan

[73] Assignee: Fujitsu Limited, Kawasaki, Japan

[21] Appl. No.: 331,290

[22] Filed: Dec. 16, 1981

[30] Foreign Application Priority Data

Dec. 24, 1980 [JP] Japan ................... 55-183447
Dec. 24, 1980 [JP] Japan ................... 55-183430

[51] Int. Cl.³ .............. H03K 19/017; H03K 19/094; H03K 19/20
[52] U.S. Cl. .................... 307/448; 307/450
[58] Field of Search ............ 307/448, 445, 449, 450, 307/463, 482, 475

[56] References Cited

U.S. PATENT DOCUMENTS

| 3,953,743 | 4/1976 | Hollingsworth | 307/448 |
| 4,002,933 | 1/1977 | Leuschner | 307/445 |
| 4,061,975 | 12/1977 | Sugai | 307/445 |
| 4,264,829 | 4/1981 | Misaizu | 307/450 |
| 4,296,339 | 10/1981 | Murotani | 307/450 |
| 4,365,172 | 12/1982 | Prater | 307/450 |
| 4,398,101 | 8/1983 | Friauf | 307/445 |

FOREIGN PATENT DOCUMENTS

5076562 1/1977 Japan ................... 307/450

*Primary Examiner*—John S. Heyman
*Assistant Examiner*—Timothy P. Callahan
*Attorney, Agent, or Firm*—Staas & Halsey

[57] ABSTRACT

A logic circuit comprising a multi-input NOR gate, a plurality of load field-effect transistors (FET's) and a driving FET, the load FET's and driving FET being connected in series with each other between power sources and the logical output being derived from the connection points of the load FET's and the driving FET. The inputs of the NOR gate are the same as that of the load FET's. The inputs of the NOR gate are connected to the corresponding gates of the load FET's and the output of the NOR gate is connected to the gate of the driving FET.

4 Claims, 21 Drawing Figures

Fig. 1A

PRIOR ART

Fig. 1B

PRIOR ART

Fig. 1C

PRIOR ART

Fig. 2A

PRIOR ART

Fig. 2B

PRIOR ART

Fig. 2C

PRIOR ART

Fig. 3

PRIOR ART

Fig. 4

PRIOR ART

FIELD EFFECT TRANSISTOR LOGIC CIRCUIT HAVING HIGH OPERATING SPEED AND LOW POWER CONSUMPTION

BACKGROUND OF THE INVENTION

This invention relates to a logic integrated circuit, and more particularly to a logic circuit which uses a transister as a load element.

In various logic integrated circuits (IC) including a MOS integrated circuit etc., the development of integrated circuits having higher performances and larger integration scales or density has been desired.

Among the performance measurements of the logic circuits that are important are the switching rate at which a high (H) voltage level changes to a low (L) voltage level, or vice versa, in the logic circuit and the power consumption which is required to maintain an operation. Further performance measurements are the noise immunity etc. at which the logic circuit operates properly without erroneously responding to noise. On the other hand, from the standpoint of enhancing the performances of the integrated circuit, reducing the cost and improving the functions, it is desirable to raise the integration density. Among the circuit forms of the logic circuits used to realize such requirements, there are various circuit forms embodied in a bipolar integrated circuit and a MOS integrated circuit, and they each have advantageous features. In particular, the MOS integrated circuit has the merit of a high packaging density as compared with the bipolar integrated circuit and is adopted as a major circuit form in a large-scale integrated circuit (abbreviated to "LSI").

In the MOS integrated circuit, a large number of circuit types have heretofore been used, and they each have their merits and demerits. In general, an inverter circuit which is the basic gate of a logic circuit is arranged by connecting a load element to a single driving transistor. For the MOS integrated circuit, a MOS transistor is ordinarily employed as the load element. Various performance characteristics and features result from the sorts of load transistors, operating mechanisms, etc., and the circuit types of the MOS integrated circuit are classified in accordance with them. As the circuit types of prior-art MOS integrated circuits, there have been extensively used three sorts of circuits; an enhancement-enhancement type circuit (abbreviated hereinafter as "E/E type circuit"), an enhancement-depletion type circuit (abbreviated hereinafter as "E/D type circuit") and a complementary MOS circuit (abbreviated hereinafter as "C-MOS circuit").

Figure 1A:
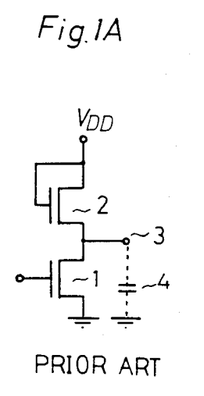
Figure 1B:
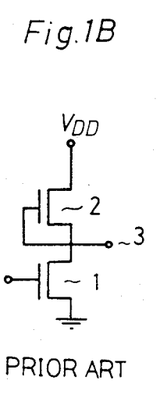
Figure 1C:
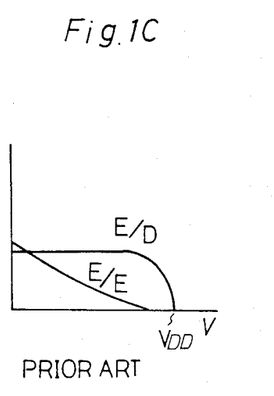
FIG. 1C is a graph illustrating the characteristics of the logic circuits of FIGS. 1A and 1B.

The E/E type circuit is a circuit which uses enhancement-mode MOS transistors for both a driving transistor and a load transistor. Usually, the gate terminal of the load transistor 2 is fixed to a power source potential as shown in FIG. 1A. On the other hand, the E/D type circuit employs an enhancement-mode MOS transistor as a driving transistor and a depletion-mode MOS transistor as a load transistor. As shown in FIG. 1B, the gate terminal of the load transistor 2 is connected to an output terminal 3. The operations of these two circuits will be briefly described. When an input is at a low (L) level such that the driving transistor 1 is in its non-conductive ("off") state, a high (H) level appears at the output terminal 3 through the pull-up load transistor 2. In contrast, when the input is at the H level, the driving transistor 1 falls into its conductive ("on") state and short-circuits the output terminal 3 to the ground potential, so that the L level appears at the output. Thus, the inverting operation is executed. The E/E type and E/D type circuits are very simple in their circuit arrangement, since they are constructed of only MOS transistors in either the n-channel or the p-channel polarity, and they are suitable for the IC implementation and thus are extensively utilized. With these circuits, however, as is apparent from the above explanation of their operation, in order to provide an L level of sufficiently low magnitude at the output when the driving transistor is "on", the current of the load transistor needs to be set at a low magnitude at below about 1/10 of the current of the driving transistor. On the other hand, when a transient response change is considered for measuring the switching rate of the gate circuit, the shift of the driving transistor from "on" to "off" and the consequent shift of the output terminal from L to H does not take place instantly, but the output potential rises for the first time when a load capacitance, (4 in FIG. 1A) composed of several parasitic capacitances existing at the output terminal point, is charged by the current from the load transistor. At this time, in the E/E type circuit, the load current is much smaller than the "on" current of the driving transistor because of the capacitance. Accordingly, the charging process takes a very long time and governs the switching speed of the gate circuit. These circumstances are apparent from the load curves of the load elements depicted as the voltage-current characteristics of the driving transistors in FIG. 1C. In particular, it is a serious disadvantage of the E/E type circuit that the load characteristic of the E/E type circuit is downwardly convex, so the charging current becomes lower with a rise in the output potential. It is the E/D type circuit that has been improved so as to attain a high charging efficiency. Since the E/D type circuit can hold the gate-source voltage of the load transistor constant, it exhibits the load characteristic of a substantially constant current as shown in FIG. 1C and operates at higher speed.

As is apparent from the explanation of the E/E and E/D circuit operation, the load transistor is normally in the "on" state in the above E/E type or E/D type circuit. Accordingly, in the gate circuit in which the driving transistor is "on", the load current normally flows from the power source potential to the ground, and power is normally consumed in order to maintain a logical state. Especially in recent years, high-speed operation has been required along with the large-scale integration. In such circuits, the operating current level needs to be made high, which causes the power consumption to increase. Thus, power consumption has become the most influential factor limiting the integration scale.

Figure 2A:
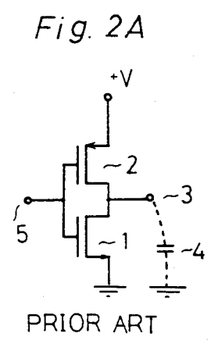
Figure 2B:
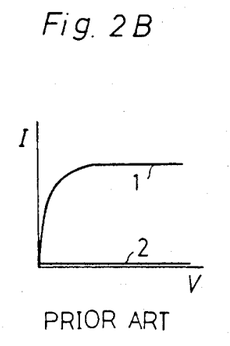
FIGS. 2B and 2C are graphs illustrating the characteristics of the logic circuit of FIG. 2A.
Figure 2C:
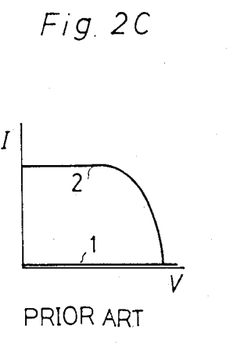

In comparison with the foregoing E/E type and E/D type circuits, the C-MOS circuit has more ideal features as the logic circuit type to be used in IC's. FIG. 2A shows a circuit diagram of the C-MOS circuit. This circuit is arranged so that transistors of both polarities, that is, an n-channel MOS transistor 1 and a p-channel MOS transistor 2, are symmetrically connected. An output terminal 3 is connected at a node between the drains of both the transistors, while an input terminal 5 is connected to the gate terminals of both the transistors. In operation, when the input is at the H level, the n-channel transistor 1 is "on", and the p-channel transistor 2 turns "off" at this time, so that the L level appears at the output. In contrast, when the input is at the L level, the n-channel transistor turns "off" and the p-channel transistor turns "on", so that the H level appears at the output. In this manner, in the C-MOS circuit, in either of the "on" and "off" states of the gate, one of the two transistors is "off" and a current path from the power source toward the ground level is not formed. Accordingly, the C-MOS circuit has the advantageous feature of very low power consumption. Operating currents of equal values alternately flow through the n-channel and p-channel transistors during the "on" and "off" states of the gate as illustrated in FIGS. 2B and 2C. Therefore, both the charging and discharging process of a load capacitance 4 can be performed with relatively large currents, and the C-MOS circuit is improved in switching speed. Since, however, the C-MOS circuit requires transistors of both polarities, i.e., the n-channel and the p-channel as stated above, its manufacturing process usually becomes very complicated, and a decrease in the good gate percentage, a rise in cost, etc. are inevitable.

With enhancement in the functions of integrated circuits and expansion of the integration scale thereof, the features of higher speed and higher integration density have been eagerly requested. To this end, a circuit type which has a power consumption low enough to allow a high-speed operation and to allow the high density of integration for which the manufacturing process is simple is needed.

SUMMARY OF THE INVENTION

An object of the present invention is to provide a logic circuit with high operating speed and low power consumption.

Another object of the present invention is to provide a logic circuit with high operating speed and low power consumption which is capable of multistage connection.

A first feature of the present invention includes a logic circuit in which an output of a first logic circuit having a plurality of inputs is applied to a first input of a second logic circuit, and a plurality of input signals entering the first logic circuit are applied to a plurality of second inputs of the second logic circuit, whereby the logic circuit is rendered high in operating speed and low in power consumption. A second feature includes a logic circuit in which field effect transistors (FETs) connected to a power source consist of an enhancement-mode FET and a depletion-mode FET having their sources, drains and gates connected in common, respectively, whereby the logic circuit is rendered capable of multistage connection.

BRIEF DESCRIPTION OF THE DRAWINGS

FIGS. 1A and 1B are circuit diagrams illustrating prior-art logic circuits, while

FIG. 2A is a circuit diagram illustrating another prior-art logic circuit, while

DETAILED DESCRIPTION OF THE PREFERRED EMBODIMENTS

Figure 3:
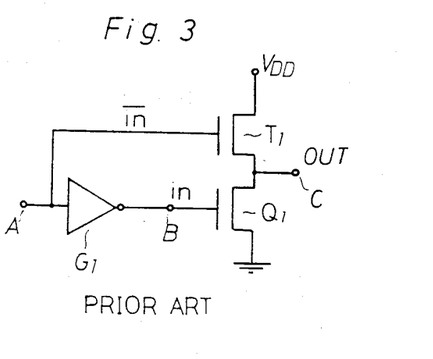
FIG. 3 is a circuit diagram illustrating a logic circuit which is rendered high in the operating speed.

FIG. 3 is a diagram showing a known inverter circuit which is rendered high in operating speed. $Q_1$ designates a driving MOS transistor, and $T_1$ a load MOS transistor. While both the transistors are of the enhancement mode, the load transistor $T_1$ may well be of the depletion mode, as will be described later. $G_1$ indicates a gate circuit of the preceding stage for applying a signal to the inverter circuit. The output signal terminal of the preceding-stage gate circuit $G_1$ is connected to the gate terminal of the driving transistor $Q_1$, while the input signal terminal of the preceding-stage gate circuit $G_1$ is connected to the gate terminal of the load transistor $T_1$. Accordingly, complementary input signals are applied to the gate terminals of the respective transistors $Q_1$ and $T_1$ which a phase shift with respect to each other corresponds to the propagation delay time of the preceding-stage gate circuit $G_1$. Except for the connection arrangement on the input side, the driving and load transistors $Q_1$ and $T_1$ are connected in series with each other between a power source voltage ($V_{DD}$) feed terminal and a ground terminal as in a conventional fashion. The juncture between both the transistors, namely, the node between the drain terminal of the driving transistor $Q_1$ and the source terminal of the load transistor $T_1$ is used as a signal output terminal.

The operation of the circuit in FIG. 3 will now be described. First, a steady state logical operation is performed as follows. When the gate terminal of the driving transistor $Q_1$ (point B in FIG. 3) is at a low (L) level, the input terminal of the preceding-stage inverter circuit $G_1$ (point A in FIG. 3) is at a high (H) level, and the H level is applied to the gate terminal of the load transistor $T_1$. At this time, the transistor $Q_1$ is in the "off" state and the transistor $T_1$ is in the "on" state, so that the H level, based on the power source voltage $V_{DD}$, appears at the output terminal (point C in FIG. 3) via the load transistor $T_1$. In contrast, when the point B is at the H level, the point A is at the L level, and the transistor $Q_1$ is turned "on" and transistor $T_1$ is turned "off", so that the L level appears at the point C. These logical operations are illustrated in the following Table 1:

TABLE 1

| A | B | $Q_1$ | $T_1$ | C |
|---|---|---|---|---|
| H | L | off | on | H |
| L | H | on | off | L |

The level relationships are inverted between the point B, being the signal input end of the inverter circuit, and the point C, being the signal output end, so that inverting operations are accomplished. To be especially noted in the operation of the circuit is that, with either of the H or L input signals, one of both the transistors $Q_1$ and $T_1$ is always in the non-conductive state. This indicates that, in the steady state, the current flow from the power source voltage ($V_{DD}$) feed terminal to the ground terminal becomes substantially zero, that is, only an infinitesimal leakage current during non-conduction flows between the two terminals. Thus, unlike the prior-art E/E type and E/D type circuits, the circuit of FIG. 3 exhibits the desired feature where the power consumption is very low. In other words, it exhibits an ideal operation with respect to power consumption similar to that of the C-MOS circuit as a switching circuit. Further, the C-MOS circuit needs the transistors of both the n-channel and the p-channel polarities, and requires isolation between the elements, etc., resulting in a conspicuously complicated process of manufacture and a low density of integration. In contrast, the circuit of FIG. 3 can be constructed of transistors of a single polarity. Therefore, it is far superior to the C-MOS circuit with respect to ease of manufacture and high packaging density.

A circuit which is apparently similar to the above logic circuit in arrangement, is a push-pull type circuit which is employed in an output buffer, etc. This circuit is arranged so that an input signal from a signal input end is inverted by an inverter circuit and the inverted input signal is applied to the gate terminal of a MOS transistor on the load side. In a steady state condition, one of a driving transistor and the load transistor is normally held in the non-conductive state, and the other in the conductive state. Thus, as in the C-MOS circuit or the circuit of FIG. 3, the power consumption is reduced, or the load drive capability is enhanced.

The push-pull type circuit, however, needs to add the inverter circuit and is clearly different from the simple arrangement of FIG. 3 in which the inverted signal is obtained from the input end of the gate circuit at the preceding stage. In addition, in the push-pull type circuit, the signal which is applied to the gate terminal of the load transistor has a phase lag corresponding to the delay time of the inverter circuit, with respect to the input signal to the driving transistor. The relationship of the phase shift is reverse to that of the circuit of FIG. 3. That is, when the output changes from the L level to the H level by way of example, the load transistor turns "on" and then the driving transistor turns "off" in the circuit of FIG. 3, whereas the driving transistor turns "off" and then the load transistor turns "on" in the push-pull type circuit described above. In the push-pull type circuit, both the load transistor and the driving transistor can turn "off" in this manner, which indicates that the change of the output from the L level to the H level is slow. On the basis of such phase shift, the circuit of FIG. 3 presents a much superior characteristic in the operating speed as compared with the above push-pull type circuit or with the conventional E/E type or E/D type circuit and even with the C-MOS circuit.

The high operating speed of the circuit of FIG. 3 is based, not only on the phase shift described above, but also on the fact that charging and discharging currents for a load capacitance during switching transient periods can be made large. The details of the reason therefor will become apparent from the following description of a transient operation.

Figure 4:
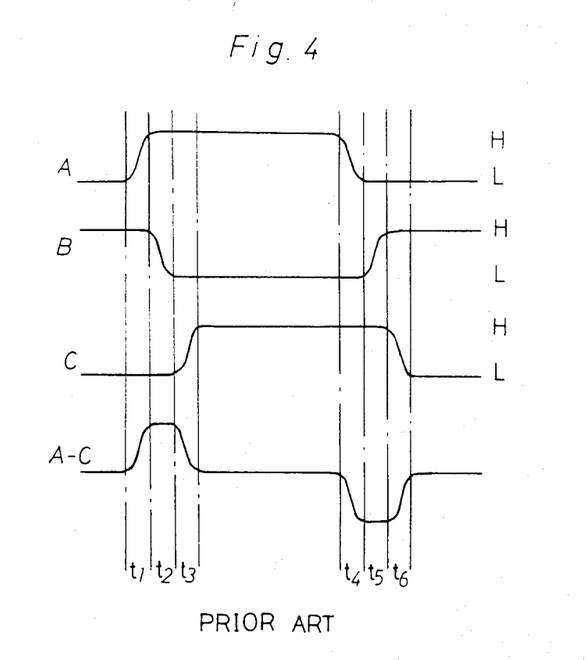
FIG. 4 is a time chart for explaining the operation of the logic of FIG. 3.

FIG. 4 is a time chart showing potential variations at the respective points A, B and C in the circuit of FIG. 3 and the variation of the potential difference A−C between the point A and the point C. This chart is for an operation at a time when the preceding-stage gate circuit $G_1$ is connected to a gate circuit of a further preceding stage having the same arrangement as the circuit of FIG. 3. It is assumed initially that the point A is at the L level and the point B, being the signal input terminal of the inverter circuit in FIG. 3, is at the H level. Accordingly, the point C being the output end becomes the L level, and the potential difference A−C between the gate and source of the load transistor $T_1$ is 0 (zero). Assuming that the level of the point A has rises from L to H, this level change occurs in a time interval $t_1$ corresponding to the delay time of the preceding-stage inverter circuit $G_1$ as compared to the timing at which the point B being the signal input end starts the shift from the H level to the L level. During a time interval $t_2$ during which the point B shifts to the L level and the driving transistor $Q_1$ turns "off", the level of the output end or the point C remains low. During the periods $t_1$ and $t_2$, therefore, the potential difference between the gate and source of the load transistor $T_1$ is at a high level, and the load transistor $T_1$ is in the conductive state. At the rise in the level of the point C (the output end), accordingly, a sufficiently great current can be supplied as the charging current for the load capacitance through the load transistor $T_1$ which is already in the conductive state. Therefore, the level of the output end rises rapidly in period $t_3$. Thus, the switching speed is remarkably enhanced. When the potential of the point C, being the output end, has risen sufficiently, the gate-source potential difference of the load transistor $T_1$ becomes sufficiently small, and transistor $T_1$ falls into a substantially "off" state. In practice, the potential of the point C being the output end can rise only to a potential which is lower by the component of a gate threshold voltage of transistor $T_1$ than the potential of the gate terminal of the load transistor $T_1$. It is therefore desirable to make the gate threshold value of the load transistor $T_1$ zero or a small value close thereto.

Subsequently, when the level of the point B being the signal input end starts to rise, the potential of the point A drops in a preceding period $t_4$. Thus, the gate potential of the load transistor $T_1$ becomes a level lower than the source potential thereof, namely, the potential of the point C, and this transistor falls into the perfectly non-conductive state. In this situation, the level of the point B or the gate terminal potential of the driving transistor $Q_1$ rises during a time interval $t_5$, charges in the load capacitance are discharged through the driving transistor $Q_1$ having reached its conductive state, and the level of the point C being the output end rises during a time interval $t_6$. Meantime, the load transistor $T_1$ is perfectly nonconductive. Therefore, the driving transistor $Q_1$ in the "on" state discharges the stored charges of the load capacitance rapidly, thereby lowering the level of the output end point C at high speed.

As apparent from the above description of the transient operation, with the circuit of FIG. 3, the inverted signal of the input signal of the driving transistor is previously applied to the gate terminal of the load transistor $T_1$, whereby the charging and discharging of the load capacitances are quickly effected to achieve a high-speed switching operation. Such operation is basically simiar to the C-MOS circuit operation, and the charging and discharging currents of the load capacitance at switching can be made values which are, for example, 10 or more times greater than in the E/E type circuit or the E/D type circuit. With the C-MOS circuit, even in the ideal case, the on-off switching operations of the p-channel and n-channel MOS transistors takes place simultaneously at the best. From the transient viewpoint, the circuit of FIG. 3 can make the charging and discharging currents greater immediately after the initiations of the charging and discharging of the load capacitance, and it can realize an operation of higher speed.

With the push-pull type inverter circuit previously discussed, the phase of the gate input signal to the load side transistor lags by the component of the delay time of the inverter circuit compared to the driving transistor. Therefore, the effect of increasing the charging and discharging currents for the load capacitances during transient operations is not produced at all.

In the foregoing operation, each of the time intervals $t_1$–$t_6$ corresponds to the delay time per gate stage. As already stated, if the preceding-stage gate circuit $G_1$ or the preceding-stage gate circuit anterior thereto has the same arrangement as that of the logic gate circuit in FIG. 3, its delay times $t_1$ and $t_2$ or $t_4$ and $t_5$ will be identical to the delay times $t_3$ and $t_4$.

Although, in the circuit of FIG. 3, the load transistor $T_1$ has been embodied by the enhancement-mode type MOS transistor, it may well be of the depletion mode type. When the load transistor $T_1$ is of the depletion mode type, the state in which current flows through the load transistor steadily occurs, but the charging capability of the load capacitance is further enhanced and a still higher operating speed can be realized. Also in this case, the inverted signal is impressed on the gate terminal of the load transistor prior to the input signal of the gate circuit, and at the switching, the conductance of the load transistor is changed in advance in a direction suitable for the rapid charging and discharging operations of the load capacitance, whereby a high-speed operation is achieved.

As set forth above, the circuit of FIG. 3 has the ideal operating mechanism in which the driving and load transistors switch "on" and "off" alternately as in the C-MOS circuit, and it has the special feature of high-speed operation at very low power consumption as compared with the E/E type circuit and the E/D type circuit. On the other hand, since it can be constructed of transistors of a single polarity, it does not involve the problems of a complicated process for manufacture, such as the lowering of the density of integration due to the isolation between the elements, a malfunction attributed to a parasitic thyristor action, etc. as in the C-MOS circuit. Accordingly, the circuit of FIG. 3 has the ideal characteristics and properties as a logic integrated circuit unit.

While the circuit of FIG. 3 is an inverter circuit which is the basic gate circuit or unit of the logic circuit, a logic gate circuit of a plurality of inputs having the AND function and the OR function is needed in order to actually perform a complicated logical function. In applying the circuit of FIG. 3 to such multi-input logic gate circuits, special modifications are further required.

Figure 5:
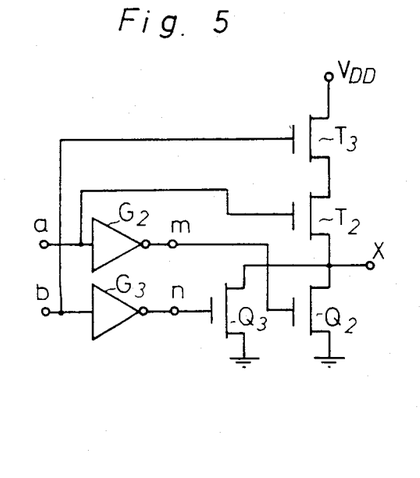
FIGS. 5 and 6 are circuit diagrams each showing an application of the logic circuit of FIG. 3.

A 2-input NOR gate circuit to which the circuit of FIG. 3 is applied is shown in FIG. 5. Although the number of inputs is two here, it is to be understood from the ensuing description that the arrangement can be extended to a multi-input arrangement having three or more inputs.

Referring to FIG. 5, $Q_2$ and $Q_3$ designate driving transistors which are connected on the ground side in parallel with each other, and $T_2$ and $T_3$ designate load transistors which are connected on the power source ($V_{DD}$) side in series with each other. In the present example, all these transistors are enhancement-mode MOS transistors. $G_2$ and $G_3$ designate preceding-stage gate circuits which apply signals to the inputs m and n of the 2-input NOR gate respectively, and which are illustrated as inverter circuits here. The output terminals m and n of the preceding-stage gates $G_1$ and $G_2$ are respectively connected to the driving transistors $Q_2$ and $Q_3$, while the inputs a and b of the preceding-stage gate circuits $G_2$ and $G_3$ are respectively connected to the gate terminals of the load transistors $T_2$ and $T_3$. The output terminal X of this NOR gate circuit is provided at the node between the drains of the driving transistors $Q_2$ and $Q_3$. As a consequence of such a circuit arrangement, the outputs of the preceding-stage gates are applied to the gate terminals of the driving side transistors. At this time, input signals which are the inverted signals of the outputs of the preceding-stage gates are applied to the load side transistors. Therefore, the "on" and "off" of the driving elements and the load elements can be set in opposite conduction states without fail, and an ideal switching operation is attained. The operations of the NOR circuit are tabulated in the following Table 2:

TABLE 2

| a | b | m | n | $Q_2$ | $Q_3$ | $T_2$ | $T_3$ | X |
|---|---|---|---|---|---|---|---|---|
| H | H | L | L | off | off | on | on | H |
| H | L | L | H | off | on | on | off | L |
| L | H | H | L | on | off | off | on | L |
| L | L | H | H | on | on | off | off | L |

From this table, it will be obvious that the circuit of FIG. 5 has the function of producing the NOR output X in response to the inputs m and n.

Figure 6:
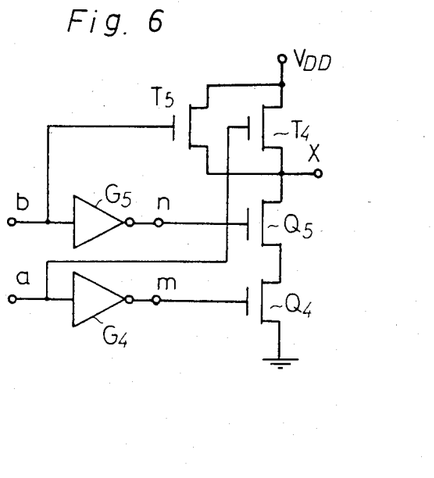

Now, a 2-input NAND circuit to which the circuit of FIG. 3 is applied is shown in FIG. 6. Also in this case, it is a matter of course that the number of inputs can be readily extended to three or more. Referring to FIG. 6, $Q_4$ and $Q_5$ indicate driving enhancement-mode MOS transistors which are connected in series, while $T_4$ and $T_5$ indicate load transistors which are connected in parallel between a power source terminal $V_{DD}$ and an output terminal X. $G_4$ and $G_5$ represent preceding-stage gate circuits the output ends m and n of which are respectively connected to the gates of the driving transistors $Q_4$ and $Q_5$ being the signal input ends of the NAND circuit and the inputs a and b of which are respectively connected to the gate terminals of the load transistors $T_4$ and $T_5$. As a consequence of such an arrangement, similarly to the foregoing NOR gate circuit, logical signals which are of opposite levels are applied to the driving elements and the load elements. In addition, transient signals are applied to the load elements prior in time to the signals applied to the driving elements for a component corresponding to one logic gate stage. The circuit arrangement of FIG. 6 operates in a steady signal status as listed in Table 3 below, and it is understood that the NAND function is executed. Except for the transient operation, the transistor in the "off" state is always interposed between the supply voltage $V_{DD}$ and the ground potential, so that the power consumption becomes very low. Further, the charging and discharging of the load capacitance proceeds quickly during the transient operation, so that the switching operation is carried out at high speed.

TABLE 3

| a | b | m | n | $Q_4$ | $Q_5$ | $T_4$ | $T_5$ | X |
|---|---|---|---|---|---|---|---|---|
| H | H | L | L | off | off | on | on | H |
| H | L | L | H | off | on | on | off | H |

TABLE 3-continued

| a | b | m | n | Q4 | Q5 | T4 | T5 | X |
|---|---|---|---|----|----|----|----|---|
| L | H | H | L | on | off | off | on | H |
| L | L | H | H | on | on | off | off | L |

As apparent from the above description, not only the inverter circuit of FIG. 3, but also a multi-input NOR gate circuit or multi-input NAND gate circuit having any desired number of inputs can be arranged by applying the circuit of FIG. 3. Accordingly, any desired logical function can be realized by properly combining such application circuits.

The foregoing circuit of FIG. 3, however, has been usable for only data passed through an inverter. It has not been applicable to, for example, a NAND circuit, a NOR circuit etc. because such a logic circuit at the preceding stage has a plurality of inputs. This has been a serious problem when a large number of logic circuits are integrated. That is, each of most logic circuits includes NAND circuits, NOR circuits etc., and it is meaningless to enhance the operating speed of just a part of the logic circuit. This invention provides a logic circuit which can enhance the operating speed, not only for the signals of the prior-art inverter circuit, but also for logic circuits such as a NAND circuit and NOR circuit.

Figure 7:
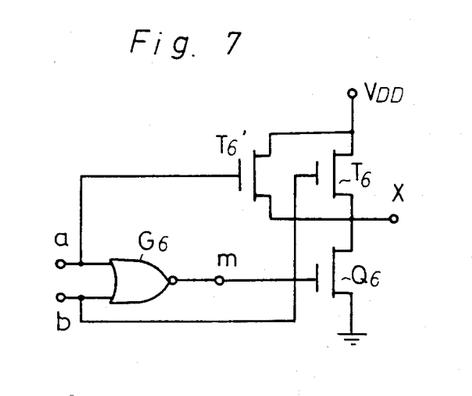
FIGS. 7, 8, 9 and 10 are circuit diagrams each illustrating embodiments of the present invention.

FIG. 7 shows the circuit of a first embodiment in which an inverter circuit, in which a 2-input NOR gate circuit $G_6$ is a preceding-stage gate circuit, is arranged in accordance with this invention. Even in a case where the preceding-stage NOR gate circuit $G_6$ has three or more inputs, the arrangement may be similarly made. In FIG. 7, $Q_6$ indicates a driving transistor which is operated by the output of the NOR gate $G_6$. $T_6$ and $T_6'$ indicate load transistors which are connected in parallel with each other, and the gate terminals of which are respectively supplied with the inputs b and a of the preceding-stage NOR gate $G_6$. As a result, the load elements $T_6$ and $T_6'$ are supplied with two signals which are prior in time to an input signal impressed on a point m, being the input end of the present inverter circuit, and supplied by a component corresponding to one stage of the NOR gate $G_6$. Accordingly, as is apparent from the following Table 4 indicative of the logic operations of the present circuit, one of the driving transistor $Q_6$ and the load transistor pair $T_6$ and $T_6'$ is always in the "off" state in a path extending from a supply voltage $V_{DD}$ to the ground potential, and the circuit operates so as to block the current path:

TABLE 4

| a | b | m | Q6 | T6 | T6' | X |
|---|---|---|----|----|----|---|
| L | L | H | on | off | off | L |
| L | H | L | off | on | off | H |
| H | L | L | off | off | on | H |
| H | H | L | off | on | on | H |

Figure 8:
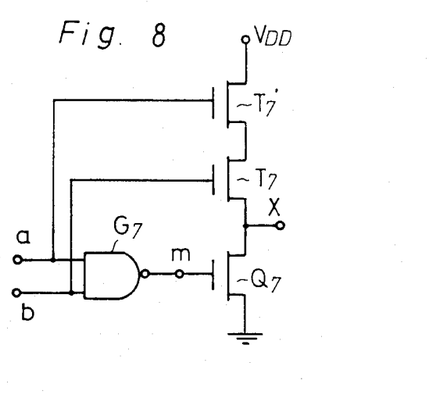

Now, as another example of a connection of a multi-input gate, a second embodiment of this invention in which an inverter is driven with outputs from a 2-input NAND gate will be described with reference to FIG. 8. It will be readily understood that the example can of course be extended to an arrangement whose preceding stage is a multi-input NAND gate having three or more inputs. In FIG. 8, $Q_7$ indicates a driving transistor, $T_7$ and $T_7'$ load transistors, and $G_7$ a 2-input NAND gate circuit. The point of difference of the present circuit connection arrangement from the circuit of the embodiment of FIG. 7 is that the load transistors $T_7$ and $T_7'$ are connected in series and during a steady state operation, one of the transistors $Q_7$, $T_7$ and $T_7'$ is always in the "off" state and makes very high the impedance of the current path between a power source $V_{DD}$ and the ground. The logical operations of the circuit in FIG. 8 are listed in the following Table 5:

TABLE 5

| a | b | m | Q7 | T7 | T7' | X |
|---|---|---|----|----|----|---|
| L | L | H | on | off | off | L |
| L | H | H | on | on | off | L |
| H | L | H | on | off | on | L |
| H | H | L | off | on | on | H |

As understood from the above description of the two sorts of circuits, when a logic circuit, in which a multi-input logic gate circuit is a preceding-stage gate circuit, is arranged in accordance with this invention, load transistors equal in number to the inputs of the preceding-stage gate circuit may be disposed in such a manner that the input terminals of the preceding-stage gate circuit are respectively connected to the gate terminals of the load transistors. When the preceding-stage gate circuit is a NOR circuit, the load transistors are connected in parallel with each other, and when it is a NAND circuit, they are connected in series. Thus, the merits of this invention; a very low power consumption and a high-speed switching operation are attained irrespective of the number of the inputs of the preceding-stage gate circuit.

The embodiments of this invention shown in FIGS. 7 and 8 correspond to a case where the inverter function is realized with the load transistors and the driving transistor.

Figure 9:
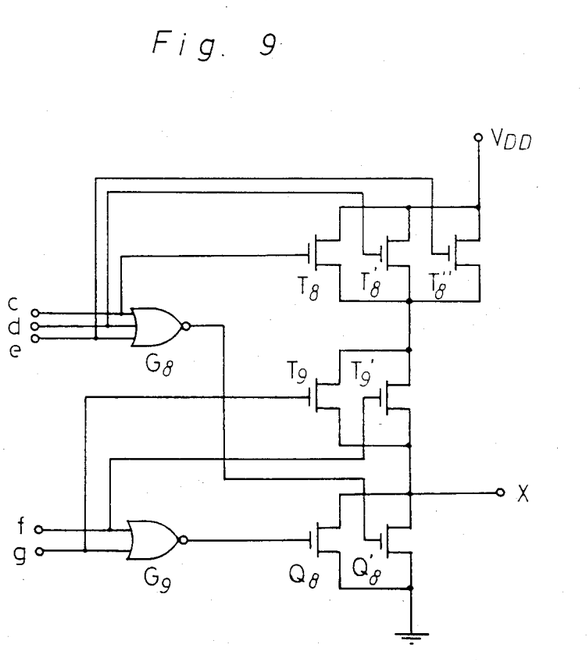

Now, cases where the logic circuit of this invention is used to realize the NOR and NAND functions will be described. FIG. 9 shows a third embodiment of this invention in which preceding-stage circuits are a 3-input NOR circuit $G_8$ and a 2-input NOR circuit $G_9$ and which provides the NOT OR logic between the outputs of the NOR circuits $G_8$ and $G_9$. The drains and sources of load transistors $T_8$, $T_8'$ and $T_8''$ are respectively connected in common. The gates of the load transistors $T_8$, $T_8'$ and $T_8''$ are respectively connected to input terminals c, d and e which are connected to the inputs of the NOR circuit $G_8$. Likewise, the drains and sources of load transistors $T_9$ and $T_9'$ are respectively connected in common, and the gates thereof are respectively connected to input terminals g and f which are connected to the inputs of the NOR circuit $G_9$. The drains and sources of driving transistors $G_8$ and $G_8'$ are respectively connected in common, and the gates thereof are respectively connected to the outputs of the NOR circuits $G_9$ and $G_8$. The load transistors $T_8$, $T_8'$ and $T_8''$ have their drains connected to a power source $V_{DD}$, and have their sources connected to the drains of the load transistors $T_9$ and $T_9'$. The driving transistors $Q_8$ and $Q_8'$ have their drains connected to an output terminal X and also to the sources of the load transistors $T_9$ and $T_9'$, and they have their sources grounded. When all the inputs c, d and e are of the L level, all the load transistors $T_8$, $T_8'$ and $T_8''$ turn "off", and current from the power source is cut off. At this time, the driving transistor $G_8'$ turns "on", and the output becomes the L level. Similarly, when both the inputs f and g are of the L level, both the load transistors $T_9$ and $T_9'$ turn "off", and the current from the power source is cut off. At this time, the driving transistor $Q_8$ turns "on", and the output becomes the L level. However, when at least one of the inputs c, d and e is of the H level and when at least either of the inputs f and g is of the H level, both the outputs of the NOR circuits $G_8$ and $G_9$ become the L level, and the driving transistors $Q_8$ and $Q_8'$ turn "off". At this time, at least one of the load transistors $T_8$, $T_8'$ and $T_8''$ turns "on" and at least either of the load transistors $T_9$ and $T_9'$ turns "on", so that the output X becomes the H level. In this manner, in the third embodiment of the present invention, when the supply voltage is provided at the output X through the load transistors $T_8$, $T_8'$ and $T_8''$ and the load transistors $T_9$ and $T_9'$, both the driving transistors $Q_8$ and $Q_8'$ are "off". In the reverse case, that is, when at least either of the driving transistors $Q_8$ and $Q_8'$ is "on", all the load transistors $T_8$, $T_8'$ and $T_8''$ are "off" or both the load transistors $T_9$ and $T_9'$ are "off". During the steady state, therefore, no power is consumed within the circuit.

Figure 10:
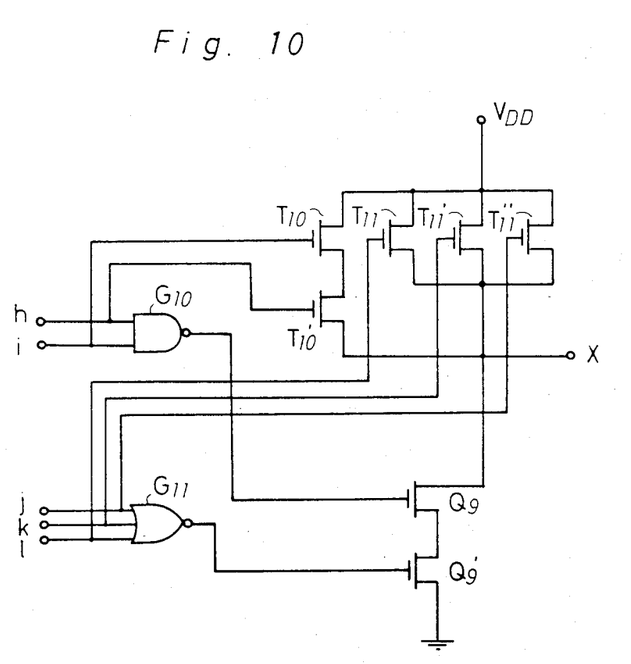

FIG. 10 shows a fourth embodiment of this invention. In the fourth embodiment, preceding-stage circuits are a 2-input NAND circuit $G_{10}$ and a 3-input NOR circuit $G_{11}$, and the NOT AND logic between the outputs of the circuits $G_{10}$ and $G_{11}$ is provided as an output. A load transistor $T_{10}$ has its drain connected to a power source $V_{DD}$, and has its source connected to the drain of a load transistors $T_{10}'$. The gates of these load transistors $T_{10}$ and $T_{10}'$ are respectively connected to inputs i and h with which the inputs of the NAND circuit $G_{10}$ are connected. The sources and drains of load transistors $T_{11}$, $T_{11}'$ and $T_{11}''$ are respectively connected in common, and the drains are connected to a power source $V_{DD}$. Further, the gates of the load transistors $T_{11}$, $T_{11}'$ and $T_{11}''$ are respectively connected to inputs l, k and j with which the inputs of the NOR circuit $G_{11}$ are connected. The gates of driving transistors $Q_9$ and $Q_9'$ are respectively connected to the outputs of the NAND circuit $G_{10}$ and the NOR circuit $G_{11}$. The drain of the driving transistor $Q_9$ is connected to the source of the load transistor $T_{10}'$ and also to the sources of the load transistors $T_{11}$, $T_{11}'$ and $T_{11}''$. The driving transistor $Q_9'$ has its drain connected to the source of the driving transistor $Q_9$, and has its source grounded. In the circuit of the fourth embodiment, no steady current flows as in the first, second and third embodiments described before. More specifically, when at least one of the inputs of the NOR circuit $G_{11}$ is of the H level, the driving transistor $Q_9'$ turns "off", and conversely at least one of the load transistors $T_{11}$, $T_{11}'$ and $T_{11}''$ turns "on", so that the output X becomes the H level. When both the inputs h and i are of the H level, the output of the AND circuit $G_{10}$ becomes the L level, with the result that the driving transistor $Q_9$ turns "off". At this time, both the load transistors $T_{10}$ and $T_{11}$ are "on", so that the output X becomes the H level. However, when all the inputs j, k and l are of the L level and where at least either of the inputs h and i is of the L level, both the driving transistors $Q_9$ and $Q_9'$ turn "on". At this time, all the load transistors $T_{11}$, $T_{11}'$ and $T_{11}''$ are "off" and one of the load transistors $T_{10}$ and $T_{10}'$ is "off", so that current does not flow through the driving transistors via the load transistor. In this manner, also in the fourth embodiment, no power is consumed during steady state and an integrated circuit of low power consumption is realizable.

The "on" and "off" timings of the first, second, third and fourth embodiments are the same as the "on" and "off" timings of the load transistor and the driving transistor in the prior-art circuit shown in FIG. 3, and the operating speed is rendered high.

In each of the first to fourth embodiments of this invention, an example of the logic circuit is employed, and any kind of logic circuit can be used as the preceding-stage logic circuit. Further, circuits of all logical forms can be realized by appropriately combining load transistors and driving transistors.

In the foregoing description of the embodiments of this invention, use in a multi-stage connection has not been illustrated. When the embodiments of this invention are connected in cascade into a plurality of stages, the problem in practical use is that the signal level lowers occurs in some cases as it passes through each stage.

Now, this problem will be explained with reference to FIG. 11. The figure shows a circuit example in which inverter gate circuits $G_{12}$–$G_{15}$ are connected in cascade. The inverter circuit $G_{12}$ of the first stage is of the conventional E/E type, whereas the second stage $G_{13}$ and the succeeding stages are constructed on the basis of the fundamental circuit arrangement according to this invention. $Q_{12}$–$Q_{15}$ designate driving transistors, and $T_{12}$–$T_{15}$ enhancement-mode MOS transistors for loads. They are assumed to have common gate threshold values $V_{th}$, respectively.

Figure 11:
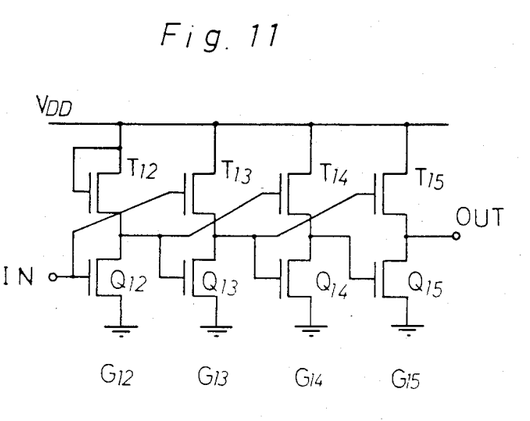
FIG. 11 is a circuit diagram illustrating the multistage connection of logic circuits.

In the logic circuit of FIG. 11, when an L level signal substantially equal to the ground potential is applied to an input end IN, the output of the inverter circuit $G_{12}$ at the first stage becomes the H level. As is well known, the actual potential of the H level is a potential $(V_{DD}-V_{th})$ which is lower than the supply voltage $V_{DD}$ applied to the gate of the load transistor $T_{12}$, by the threshold value $V_{th}$ of this transistor. The L level input of the first-stage gate $G_{12}$ is applied to the gate of the load transistor $T_{13}$ of the second-stage gate $G_{13}$ and brings this transistor into the "off" state. On the other hand, the output signal of the level $(V_{DD}-V_{th})$ is also applied to the gate of the driving transistor $Q_{13}$. Accordingly, when the gate threshold value of the driving transistor $Q_{13}$ is smaller than the output signal level $(V_{DD}-V_{th})$, the transistor $Q_{13}$ turns "on", and the L level signal substantially equal to the ground potential is provided at the output end of the second-stage gate $G_{13}$. In the subsequent third-stage gate $G_{14}$, the L level signal at substantially equal to the ground potential is applied to the gate of the driving transistor $Q_{14}$, so that the transistor $Q_{14}$ falls into the "off" state. On the other hand, the gate of the load transistor $T_{14}$ is supplied with the output signal of the first-stage gate $G_{12}$, the level of this signal being $(V_{DD}-V_{th})$. Therefore, the output end potential of the third-stage gate $G_{14}$ rises, but only to a magnitude $(V_{DD}-2V_{th})$, which is still lower than the gate potential of the transistor $T_{14}$ by $V_{th}$, is obtained as the output potential.

Quite similarly to the above, when the ordinary H level signal of $(V_{DD}-V_{th})$ is applied to the first-stage gate $G_{12}$, signal levels lower successively in each stage in such a manner that the output of the second stage $G_{13}$ which ought to be the H level becomes $(V_{DD}-2V_{th})$ and that the output of the fourth stage $G_{15}$ becomes $(V_{DD}-3V_{th})$. Eventually, there can occur the situation in which even the H level signal cannot turn "on" the driving transistor of the succeeding stage.

Such a problem of the lowering of the signal level can be eliminated by, for example, employing depletion-mode transistors as the load transistors. In that case, however, it is difficult to attain the effect of remarkably reducing the power consumption by either the load element or the driving element being always brought into the non-conductive state in the steady state condition.

Figure 12:
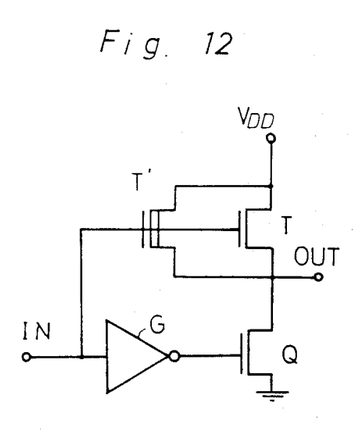
FIG. 12 is a circuit diagram illustrating an embodiment of the present invention.

In this invention, therefore, toward the end of solving the above problem, load elements are constructed of an enhancement-mode transistor and a depletion-mode transistor whose sources, drains and gates are respectively connected in common. FIG. 12 is a circuit diagram showing the fifth embodiment of the logic circuit according to this invention which employs such load elements. The embodiment is such that the construction of the load elements is applied to the fundamental circuit arrangement in which two inverter circuits are connected in cascade as in the example of FIG. 3. Referring to FIG. 12, Q designates a driving transistor, T and T' designate enhancement-mode and depletion-mode MOS transistors for loads, respectively, and G designates an inverter circuit at the preceding stage. As will be understood from the above description, the depletion-mode load transistor T' is intended to refresh or restore the signal level, and its gate threshold value assumes a negative value (in case of the n-channel type). That is, the depletion-mode load element T' is provide for the purpose of raising the output level of the logic circuit of FIG. 12 up to a supply voltage $V_{DD}$ in the state in which this logic circuit steadily provides the H level. The purpose can be achieved only if the element T' is capable of causing a slight current to flow. On the other hand, in the logical status which ought to deliver the L level, that is, in the state in which the H level is applied to the gate terminal of the driving transistor Q and the L level is applied to the load transistors T and T', current flows through the depletion-mode load transistor T' besides through the driving transistor Q, and power consumption is induced. It is therefore desirable that the current to flow through the depletion-mode load element T' is limited to a comparatively small value. It is therefore desirable to make the gate width of the depletion-mode load element smaller than that of the driving transistor Q.

Since the enhancement-mode load element T is the load transistor for the original push-pull operation, it has its current capacity made large in order to permit a high-speed transient change. To this end, the gate width of the load element T is made approximately equal to that of the driving element Q. In this case, it does not occur in the steady state that both the enhancement-mode load element T and the driving transistor Q fall into the "on" states, and excess power consumption is not caused.

In this manner, the second feature of the present invention consists in that the enhancement-mode load is employed in the fundamental operation in order to realize the low power consumption and the high operating speed owing to the push-pull operation, while the depletion-mode load having a small current capacity is employed in order to refresh the signal level, in other words, in order to provide an output level not affected by the gate threshold value. Although the load elements may well be constructed by interconnecting discrete enhancement-mode and depletion-mode transistors, a unitary load element is readily fabricated within an integrated circuit. The plan structure of a practicable unitary load element as a sixth embodiment is shown in FIG. 13.

Figure 13:
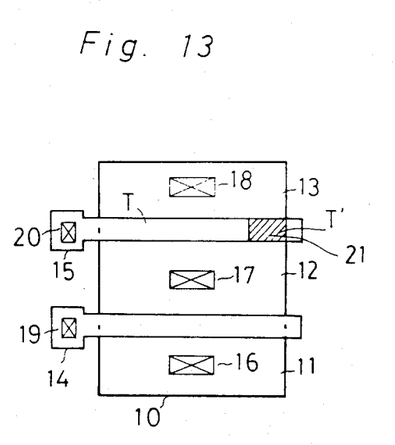
FIG. 13 is a plan structural view illustrating an embodiment of an integrated circuit according to the present invention.

Shown in FIG. 13 is an example of the practicable plan structure of a portion which corresponds to one stage of an inverter circuit according to this invention. Numeral 10 designates an element region which is surrounded with a field region, numeral 11 the source region of a driving element (n-channel type MOS transistor), numeral 12 a region which serves both as the drain region of the driving element and as the source region of a load element, numeral 13 the drain region of the load element, numeral 14 the gate electrode of the driving element, and numeral 15 the gate electrode of the load element. Numerals 16, 17 and 18 indicate the connection portions of a ground lead, an output end lead and a power source ($V_{DD}$) lead, respectively. Numerals 19 and 20 indicate the connection portions of leads from the output end and input end of a preceding-stage gate circuit, respectively. It is the feature of the structure of the present embodiment that the load element has its greater part fabricated similarly to an enhancement-mode MOS transistor, but that it is fabricated so as to exhibit depletion characteristics in a partial region 21. The formation of the depletion region 21 is easy. For example, for an n-channel type MOS transistor, the ions of a donor impurity such as arsenic may be injected by the use of an appropriate mask such as photoresist layer for exposing the region 21, so as to form a thin n-type layer in a partial surface under the gate electrode 15.

Figure 14:
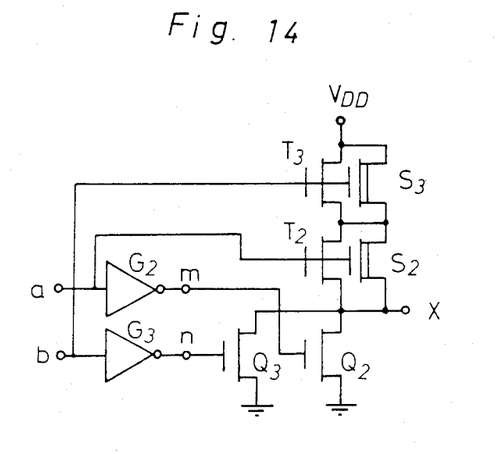
FIGS. 14, 15, 16 and 17 are circuit diagrams each illustrating an embodiment of the present invention.
Figure 15:
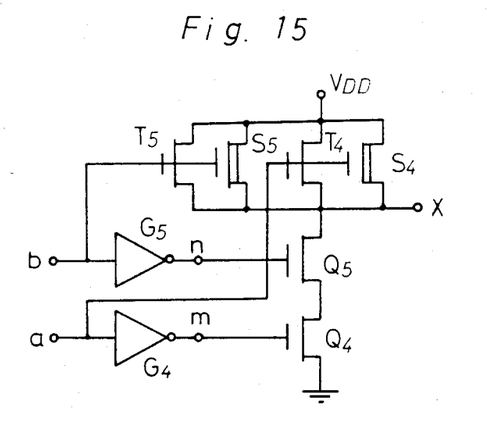
Figure 16:
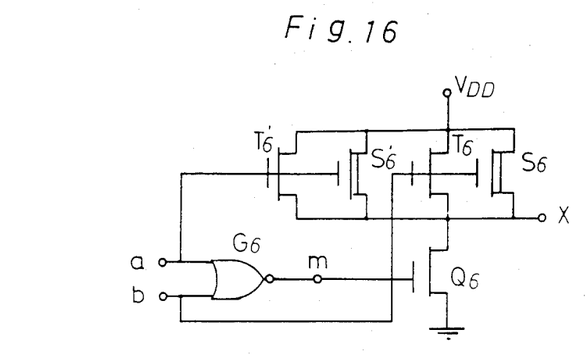
Figure 17:
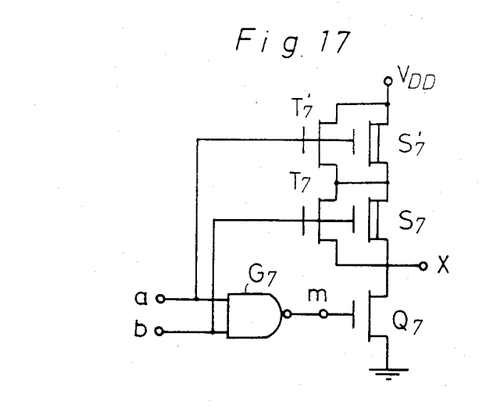

FIGS. 14 to 17 show seventh to tenth embodiments of this invention. The embodiments in FIGS. 14 and 15 are such that the present invention is applied to the prior-art logic circuits shown in FIGS. 5 and 6, respectively. The embodiments in FIGS. 16 and 17 are such that the present invention is further applied to the first and second embodiments shown in FIGS. 7 and 8, respectively. In the seventh to tenth embodiments, depletion-mode MOS transistors or enhancement-mode MOS transistors are used. For example, in FIG. 14 the drain, source and gate of a transistor $S_3$ are respectively connected to those of a load transistor $T_3$, the drain, source and gate of a transistor $S_2$ are respectively connected to those of a load transistor $T_2$; and in FIG. 15 the drain, source and gate of a transistor $S_5$ are respectively connected to those of a load transistor $T_5$. As stated before, the operations of the depletion-mode MOS transistors realize the logic circuits whose outputs X are not affected by the threshold values of input gates and which are capable of multi-stage connection.

As thus far described, this invention pertains to a logic circuit of high operating speed and low power consumption, and a logic circuit which is rendered high in the operating speed and low in the power consumption can be provided by applying this invention. Further, the logic circuit can be manufactured by a simple process and can be made low in cost.

Although the embodiments of this invention have been described as employing the MOS type FETs, they are applicable to other various transistor logic circuits.

I claim:

1. A logic circuit having first and second power source terminals and a steady state, said logic circuit comprising:

a plurality of first logic gate means for generating first logical output signals, each of said first logic gate means having at least one logical input terminal for receiving a logical input signal and generating one of the first logical output signals in response to the logical input signal; and second logic gate means, operatively coupled to said first logic gate means and having a logical output terminal, for generating a second logical output signal at the logical output terminal in response to the first logical output signals and the logical input signals and for cutting off a current path between the first and second power source terminals during the steady state, said second logic gate means comprising:

a plurality of driving field effect transistors operatively coupled between said logical output terminal and the first power source terminal, each of said driving field effect transistors having a gate terminal supplied with one of said first logical output signals; and a plurality of load means operatively coupled between said logical output terminal and said second power source terminal, the number of said load means being equal to the number of said first logic gate means, each of said load means comprising at least one load field effect transistor, each of said load field effect transistors having a gate terminal supplied with a corresponding one of the first logical input signals of the corresponding one of said first logic gate means, the coupling of said driving field effect transistors between the logical output terminal and the first power source terminal being in parallel, and the coupling of said plurality of load means between the logical output terminal and the second power source terminal being in series, thereby cutting off a current path between the first and second power source terminals during the steady state in any logical state of said first logical input signals.

2. A logic circuit as recited in claim 1, wherein each of said load means comprises a load field effect transistor corresponding to each logical input terminal where said load field effect transistors within each of said load means are operatively coupled in parallel.

3. A logic circuit having first and second power source terminals and a steady state, said logic circuit comprising:

a plurality of first logic gate means for generating first logical output signals, each of said first logic gate means having at least one logical input terminal for receiving a logical input signal and generating one of the logical output signals in response to the logical input signal; and second logic gate means, operatively coupled to said first logic gate means and having a logical output terminal, for generating a second logical output signal at the logical output terminal in response to the first logical output signals and the logical input signals, and for cutting off a current path between the first and second power source terminals during the steady state, said second logic gate means comprising:

a plurality of driving field effect transistors operatively coupled between said logical output terminal and the first power source terminal, each of said driving field effect transistors having a gate terminal supplied with one of said first logical output signals; and a plurality of load means operatively coupled between said logical output terminal and said second power source terminal, the number of said load means being equal to the number of said first logic gate means, each of said load means comprising at least one load field effect transistor, each of said load field effect transistors having a gate terminal supplied with a corresponding one of the first logical input signals of the corresponding one of said first logic gate means, the coupling of said driving field effect transistors between the logical output terminal and the first power source terminal being in series, and the coupling of said plurality of load means between the logical output terminal and the second power source terminal being in parallel, thereby cutting off a current path between the first and second power source terminals during the steady state in any logical state of said first logical input signals.

4. A logic circuit as recited in claim 3, wherein each of said load means comprises a load field effect transistor, where said load field effect transistors in at least one of said load means are operatively coupled in parallel and said field effect transistors in at least one other of said load means are connected in series.

* * * * *

UNITED STATES PATENT AND TRADEMARK OFFICE
CERTIFICATE OF CORRECTION

PATENT NO. : 4,489,246
DATED : DECEMBER 18, 1984
INVENTOR(S) : KOICHI NISHIUCHI ET AL.

It is certified that error appears in the above-identified patent and that said Letters Patent is hereby corrected as shown below:

```
Col. 3, line 38, before "logic" insert --power saving--;
        line 45, before "logic" insert --power saving--;
        line 64, after "logic" insert --circuit--.

Col. 6, line 6, delete "has";
        line 59, "simiar" should be --similar--.

Col. 9, line 14, "foreging" should be --foregoing--;

Col. 13, line 24, "provide" should be --provided--.
```

Signed and Sealed this

Seventeenth Day of September 1985

[SEAL]

Attest:

DONALD J. QUIGG

Attesting Officer

Commissioner of Patents and
Trademarks—Designate